United States Patent [19]

Kapoor

[11] Patent Number: 5,663,590

[45] Date of Patent: Sep. 2, 1997

[54] PRODUCT OF PROCESS FOR FORMATION OF VIAS (OR CONTACT OPENINGS) AND FUSES IN THE SAME INSULATION LAYER WITH MINIMAL ADDITIONAL STEPS

[75] Inventor: Ashok K. Kapoor, Palo Alto, Calif.

[73] Assignee: LSI Logic Corporation, Milpitas, Calif.

[21] Appl. No.: 690,024

[22] Filed: Jul. 31, 1996

Related U.S. Application Data

[60] Continuation of Ser. No. 462,897, Jun. 5, 1995, abandoned, which is a division of Ser. No. 348,603, Dec. 2, 1994, Pat. No. 5,472,901.

[51] Int. Cl.$^6$ .................... H01L 29/41; H01L 23/62
[52] U.S. Cl. .................................. 257/529; 257/665
[58] Field of Search ........................ 257/529, 665

[56] References Cited

U.S. PATENT DOCUMENTS

| | | | |
|---|---|---|---|
| 4,647,340 | 3/1987 | Szluk et al. | 156/662 |
| 4,679,310 | 7/1987 | Ramachandra et al. | 29/577 R |
| 5,011,791 | 4/1991 | Mastroianni | 257/529 |
| 5,026,666 | 6/1991 | Hills et al. | 437/195 |
| 5,059,555 | 10/1991 | Iranmanesh et al. | 437/192 |
| 5,124,780 | 6/1992 | Sandhu et al. | 357/67 |
| 5,144,404 | 9/1992 | Iranmanesh et al. | 357/51 |
| 5,166,556 | 11/1992 | Hsu et al. | 307/465 |
| 5,175,122 | 12/1992 | Wang et al. | 437/67 |
| 5,212,102 | 5/1993 | Iranmanesh et al. | 437/31 |
| 5,212,352 | 5/1993 | Brighton et al. | 174/264 |
| 5,365,105 | 11/1994 | Liu | 257/530 |

*Primary Examiner*—Jerome Jackson
*Attorney, Agent, or Firm*—John P. Taylor

[57] ABSTRACT

A process and resulting product are described for forming an integrated circuit structure with horizontal fuses on an insulation layer formed over other portions of the integrated circuit structure by forming rectangular recesses in the insulation layer which are subsequently filled during a subsequent metal deposition step which also serves to fill with the same metal vias or contact openings which have been etched through the insulation layer. Subsequent planarization of the deposited metal layer down to the vias or contact openings, i.e. to remove the portions of the metal layer over the insulation layer, leaves the metal in the vias or contact openings and also leaves metal stringers on the sidewalls of the rectangular recess which then serve as fusible links (fuses) which are then connected to one or more metal lines thereafter formed on the insulation layer.

7 Claims, 5 Drawing Sheets

PRODUCT OF PROCESS FOR FORMATION OF VIAS (OR CONTACT OPENINGS) AND FUSES IN THE SAME INSULATION LAYER WITH MINIMAL ADDITIONAL STEPS

CROSS-REFERENCE TO RELATED APPLICATIONS

This application is a continuation of application Ser. No. 08/462,897 filed on Jun. 5, 1995 now abandoned, which application is a division of application Ser. No. 08/348,693, filed Dec. 2, 1994 now U.S. Pat. No. 5,472,901.

BACKGROUND OF THE INVENTION

1. Field of the Invention

This invention relates to the formation of fuses in an integrated circuit structure. More particularly, this invention relates to the formation of vias or contact openings to an underlying structure, and fuses in the same insulation layer with a minimum of additional steps.

2. Description of the Related Art

In the formation of integrated circuit structures, it is sometimes desirable to provide devices such as programmable read only memory devices (PROMs) in which a fusible link or fuse is provided for each memory cell. Particular fuses to particular memory cells may then be later blown, i.e., during a write sequence, by passing sufficient current through the particular fuse to blow the fuse and thereby sever electrical connection to that particular memory cell.

Such fuses have been constructed either horizontally or vertically in the integrated circuit using conductive material such as metal or metal silicides. Horizontal fuses may be formed, for example, from a patterned layer of conductive material, while vertical fuses may comprise vertical openings in an insulation layer filled with a conductive material, such as a filled via in an insulation layer between two conductive layers or a filled contact opening in an insulation layer between a contact of an active device and a first metal layer.

Usually, however, regardless of the type of material used for the fuse, or its geographical disposition on the integrated circuit structure, i.e. either horizontal or vertical, formation of the fuse or fuses requires a number of additional mask, etching, and deposition steps which all add to the processing time and expense of the process, as well as providing additional steps at which defects or other problems may occur which could adversely impact the yield.

It would, therefore, be highly desirable to provide a process for the construction of fuses in the formation of an integrated circuit structure in which additional processing steps to form the fuses are minimized or eliminated.

SUMMARY OF THE INVENTION

The invention comprises a process and the resulting product comprising the forming of an integrated circuit structure with horizontal fuses on an insulation layer formed over other potions of the integrated circuit structure by forming rectangular recesses in the insulation layer which are subsequently filled during a subsequent metal deposition step which also serves to fill, with the same metal, vias or contact openings which have been etched through the insulation layer. Subsequent planarization of the deposited metal layer down to the vias or contact openings, i.e. to remove the portions of the metal layer over the insulation layer, leaves the metal in the vias or contact openings and also leaves metal stringers on the sidewalls of the rectangular recess which then serve as fusible links (fuses) which are then connected to one or more metal lines thereafter formed on the insulation layer.

DETAILED DESCRIPTION OF THE INVENTION

Figure 1:
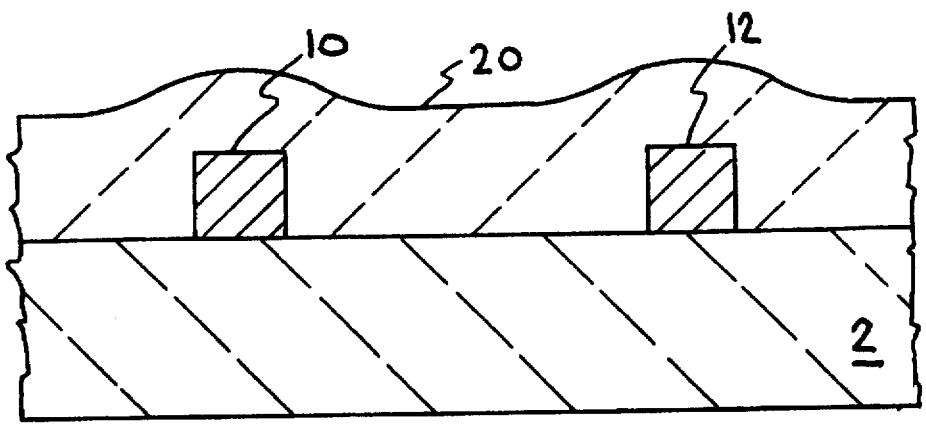
FIG. 1 is a fragmentary vertical cross-section view of a typical integrated circuit structure having metal lines formed thereon and an insulation layer formed over the metal lines, wherein vias will be subsequently etched through the insulation layer to electrically connect an upper metal level with the metal lines.

The invention provides for the formation of fuses structure in and on an integrated circuit structure in a manner in which the need for additional processing steps is minimized and/or eliminated. Referring to FIG. 1, a typical integrated circuit structure is generally indicated at 2 having, in the illustrated embodiment, metal lines 10 and 12 formed thereon over an underlying insulation layer comprising a portion of integrated circuit structure 2. An insulation layer 20 is then shown formed over metal lines 10 and 12 and integrated circuit structure 2. Typically, insulation layer 20 will comprise silicon oxide, although silicon nitride or any other equivalent insulation material could be utilized in the formation of insulation layer 20. Typically, metal lines 10 and 12, when present, will comprise aluminum, although other conductive metals, including gold, platinum, titanium, tungsten, or alloys thereof could be utilized instead of aluminum. In some instances, doped polysilicon may be used instead of metal for lines 10 and 12.

In the structure shown in FIG. 1, vias will eventually be cut (etched) through insulation layer 20 to electrically interconnect a patterned metal layer subsequently formed over insulation layer 20 with underlying metal lines 10 and 12, as will be described below.

Figure 1A:
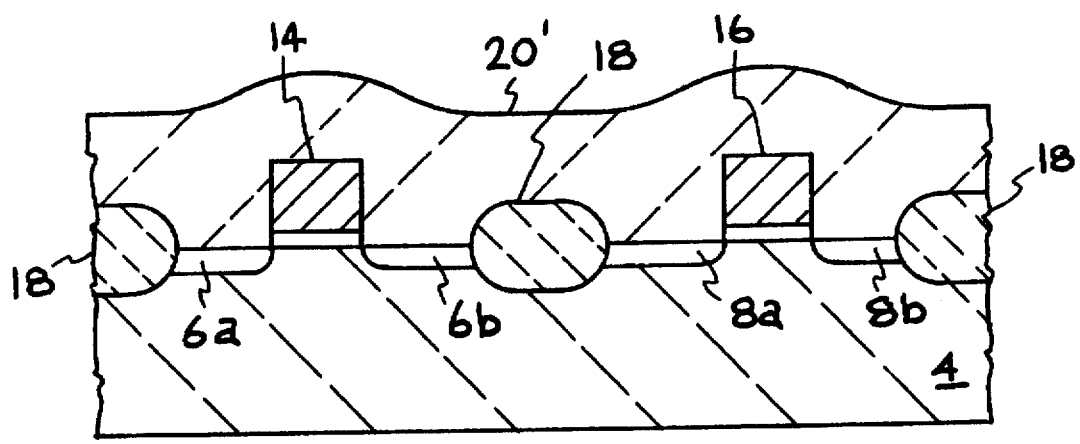
FIG. 1A is a fragmentary vertical cross-section view of another typical integrated circuit structure to which the process of the invention may be applied, with MOS devices shown formed in a substrate with raised gate electrodes and an insulation layer formed over the gate electrodes, wherein contact openings will be subsequently etched through the insulation layer to electrically connect a first metal level with the gate electrodes.

Alternatively, the process and fuse structure of the invention to be described below may be formed over a first insulation layer deposited directly over active devices formed in the semiconductor substrate of the integrated circuit structure, as shown in FIG. 1A. In FIG. 1A, a substrate 4 is shown having MOS structures formed therein bounded by field oxide portions 16 and comprising source regions 6a and 6b and drain regions 8a and 8b, with raised polysilicon gate electrodes 14 and 16 formed therebetween. An insulation layer 20' is then formed over the surface of substrate 4 and raised gate electrodes 14 and 16, resulting in a structure which topographically is similar in appearance to the structure of FIG. 1, except that the openings which will subsequently be cut (etched) through insulation layer 20' from a subsequently deposited patterned metal layer to gate electrodes 14 and 16 thereunder will be referred to as contact openings rather than vias.

Figure 2:
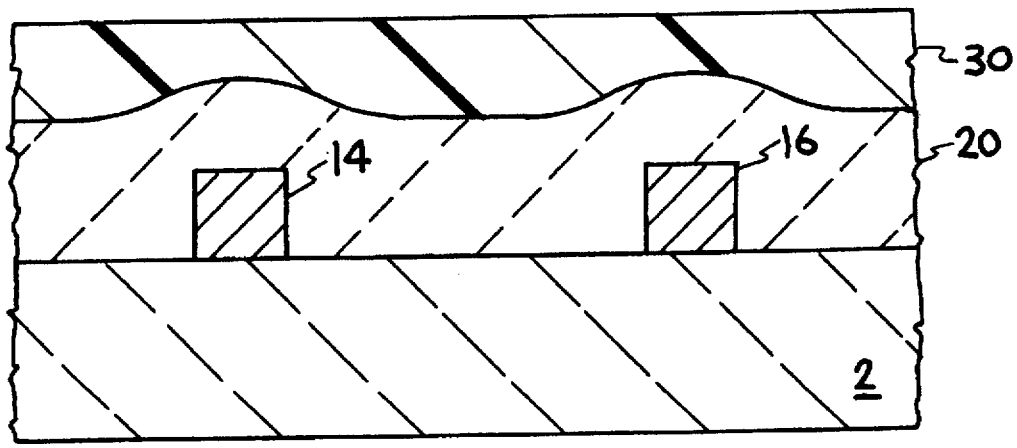
FIG. 2 is a fragmentary vertical cross-sectional view of the structure of FIG. 1 with a planarizing layer of photoresist applied over the conformal insulation layer.

As shown in FIG. 2, preferably insulation layer 20 is planarized prior to the subsequent steps and formation of the fuse structure of the invention, although it is within the scope of the invention to utilize insulation layer 20 in an unplanarized form in the process of the invention. However, subsequently lithography will be more accurate if the surface of insulation layer 20 is planarized at this stage of the process. Such planarization is conventionally accomplished by spinning a layer of photoresist 30 over insulation layer 20 to provide a relatively flat surface. Resist layer 30 and insulation layer 20 are then etched with an etching system which will etch resist and the particular insulation material at the same rate, e.g., when insulation layer 20 comprises silicon oxide, using a reactive ion etch with a fluorine-containing gas as the source of the active species in the plasma, resulting in the planar structure of FIG. 3. The resulting planarized insulation layer will hereinafter be referred to as insulation layer 20a.

Figure 3:
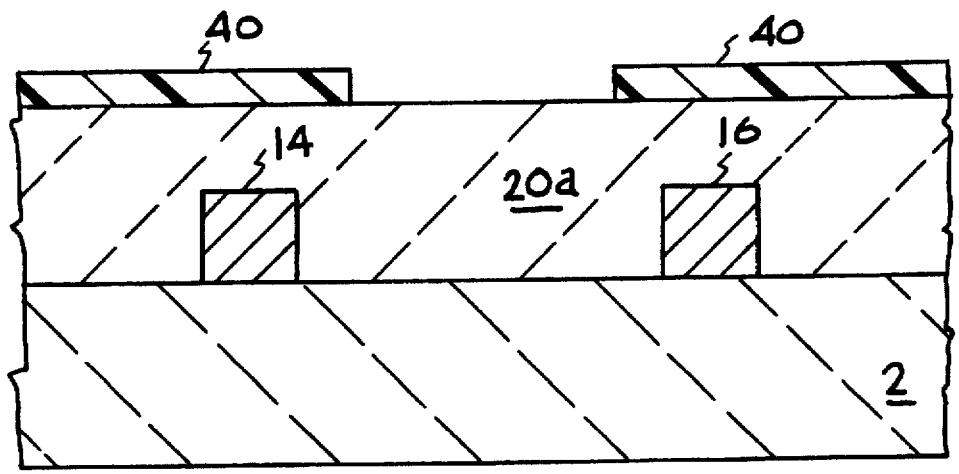
FIG. 3 is a fragmentary vertical cross-sectional view of the structure of FIG. 2 after the structure has been planarized and a further layer of photoresist has been applied and patterned to provide a mask for the formation of a rectangular fuse recess in the insulation layer.
Figure 4:
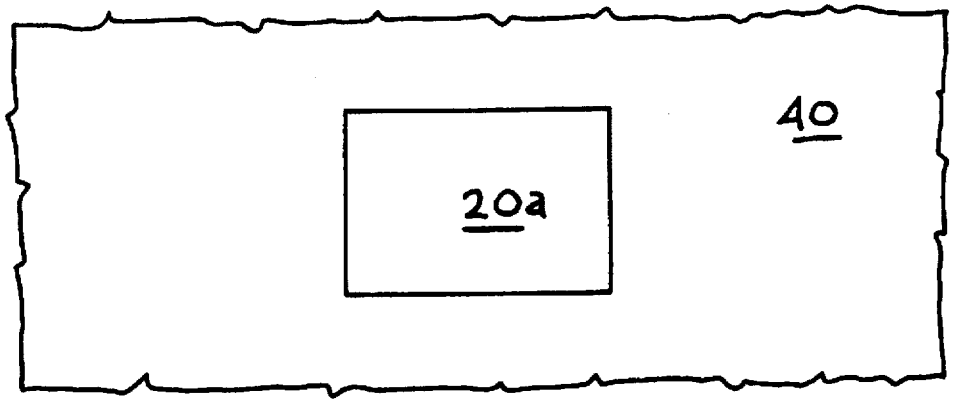
FIG. 4 is fragmentary top view of the structure of FIG. 3, showing the fuse recess mask.

A rectangular fuse recess mask 40 is then formed over planarized insulation layer 20a by applying a further layer of photoresist over insulation layer 20a and then patterning the resist to form mask 40, as shown in FIGS. 3 and 4.

Figure 5:
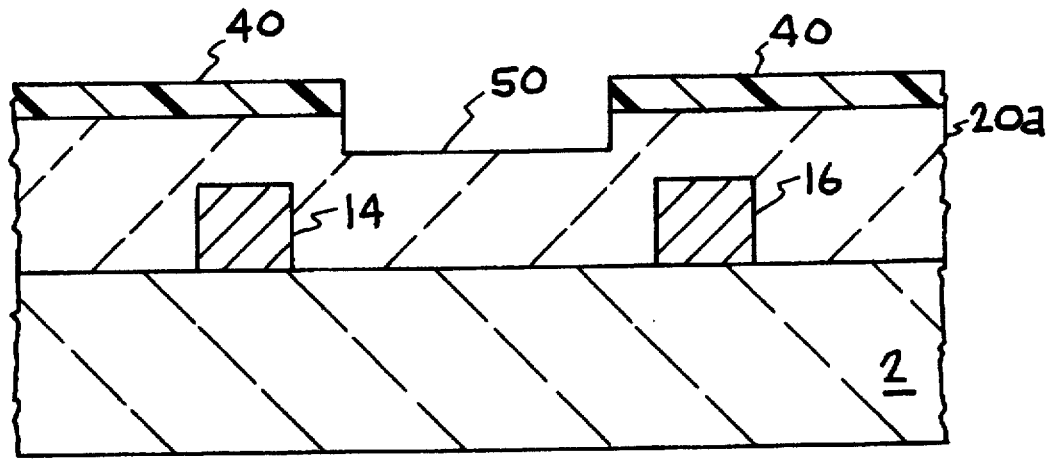
FIG. 5 is a fragmentary vertical cross-sectional view of the structure of FIG. 3 after the fuse recess has been etched in the insulation layer.

Rectangular fuse recess 50 is then formed in insulation layer 20a by anisotropically etching layer 20a through mask 40, as shown in FIG. 5. When insulation layer 20a comprises silicon oxide, as referred to above, a reactive ion etch may be used utilizing a fluorine-containing gas as the source of the reactive species in the plasma. It will be noted that the depth of fuse recess 50 is less than the thickness of insulation layer 20a in the region where fuse recess 50 will be etched into insulation layer 20a. In accordance with the invention, the depth of fuse recess 50 will also be within a range of from 0.01 to 10 times the thickness of the metal layer which will be subsequently deposited over fuse recess 50 to form the fuse of the invention. The depth of fuse recess 50, with respect to both the length and width of the rectangular fuse recess, will also be selected to provide an aspect ratio (height/width) within a range of from 0.01 to 1, preferably from 0.01 to 0.1. This will ensure that the opposite sidewalls of the rectangular fuse recess are spaced sufficiently far apart to form the desired metal stringers on the fuse recess sidewalls, as will be explained below.

Figure 6:
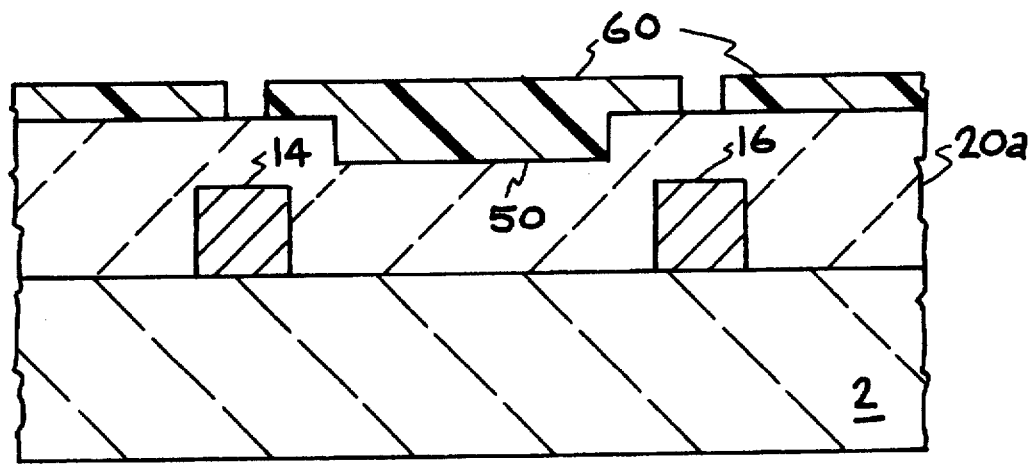
FIG. 6 is a fragmentary vertical cross-sectional view of the structure of FIG. 5 after removed of the fuse mask and formation of a via mask over the structure.
Figure 7:
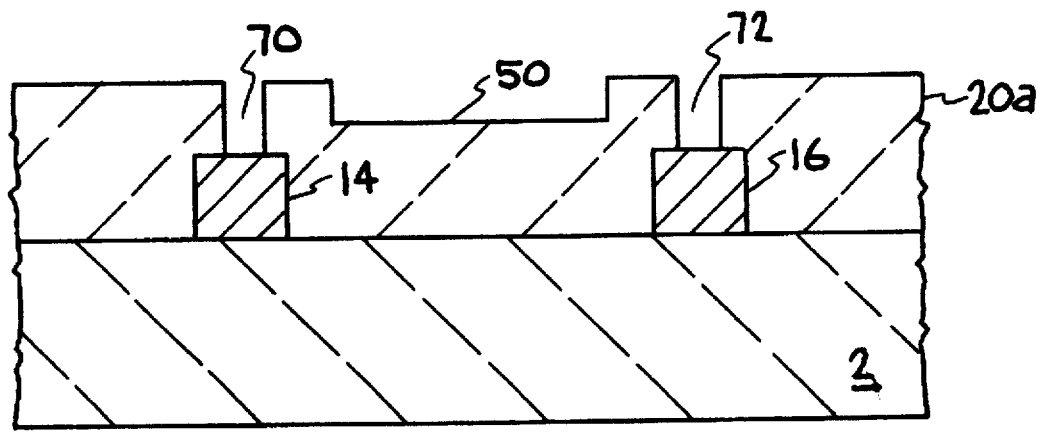
FIG. 7 is a fragmentary vertical cross-sectional view of the structure of FIG. 6 after vias to the underlying metal lines have been etched through the insulation layer and the via mask has been removed.

Following the formation of fuse recess 50, fuse mask 40 may be removed and a via or contact opening mask 60 is then formed over the structure, as shown in FIG. 6. Vias 70 and 72 are then etched through insulation layer 20a respectively to underlying metal lines 10 and 12, as shown in FIG. 7, using the same etching system as previously described for insulation layer 20a.

Figure 8:
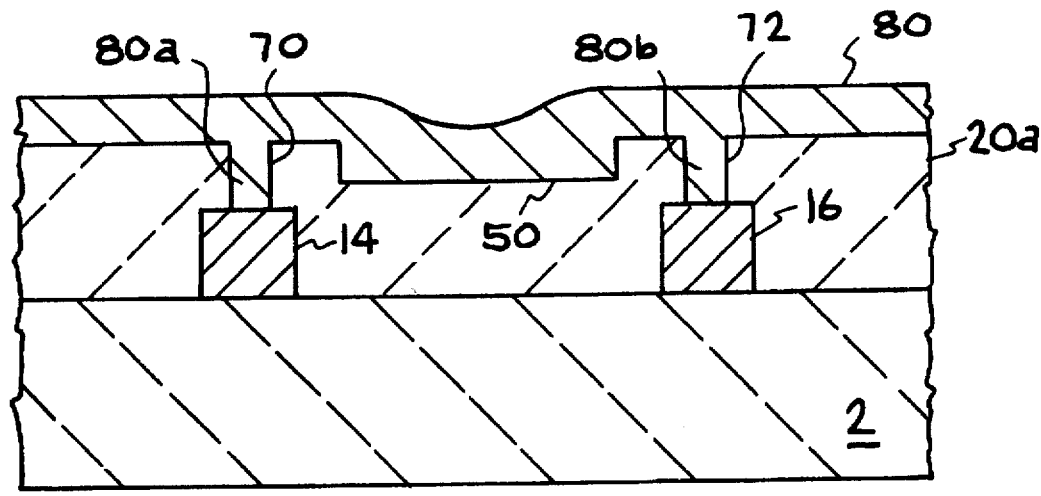
FIG. 8 is a fragmentary vertical cross-sectional view of the structure of FIG. 7 after deposition of a metal layer over the structure which fills the vias and the fuse recess.

Mask 60 is then removed and a metal layer 80 is blanket deposited over the structure, filling vias 70 and 72, as well as fuse recess 50, as shown in FIG. 8. Metal layer 80 may comprise any metal conventionally used in via formation, including titanium, tungsten, and titanium tungsten. Preferably, metal layer 80 will comprise tungsten or a tungsten-based alloy, i.e., an alloy containing at least 50 wt. % tungsten. Therefore, by way of illustration, and not of limitation, metal layer 80 will, hereinafter, be referred to as tungsten layer 80.

Figure 9:
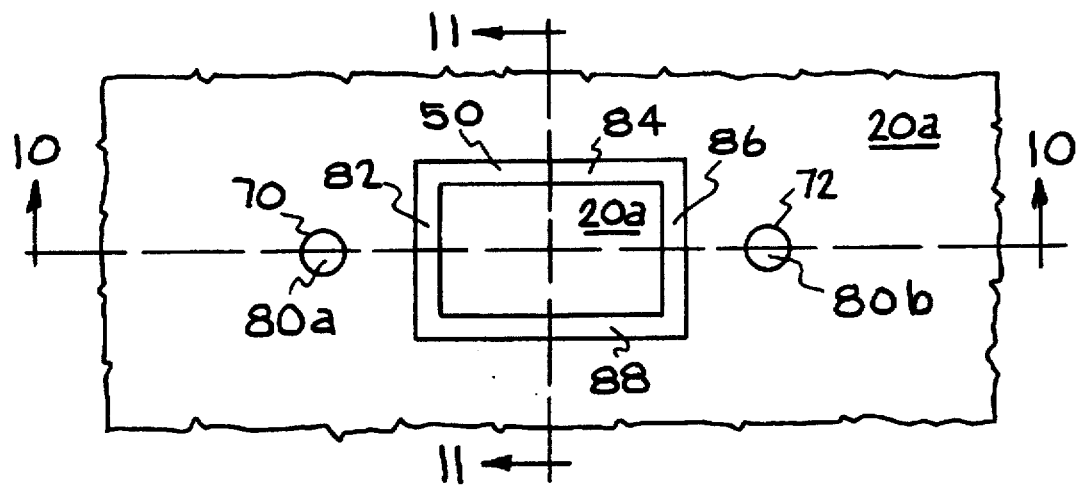
FIG. 9 is a fragmentary top view of the structure of FIG. 8 after metal layer been planarized down to the level of the insulation layer, leaving only portions of the metal in the vias and leaving metal stringers on the four sidewalls of the rectangular fuse recess.
Figure 10:
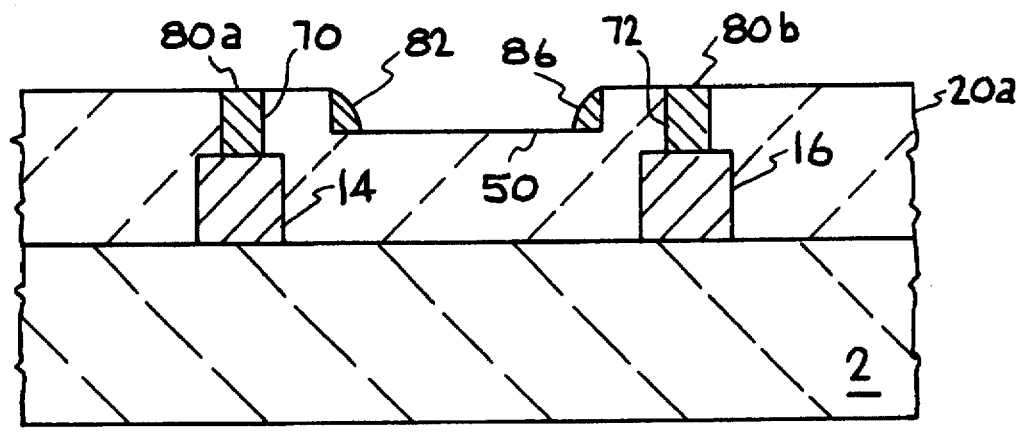
FIG. 10 is a fragmentary vertical cross-sectional view of the structure of FIG. 9 taken along lines 10—10 to show a side-section view of the structure of FIG. 9, illustrating the metal stringers formed on two opposite sidewalls of the fuse recess.
Figure 11:
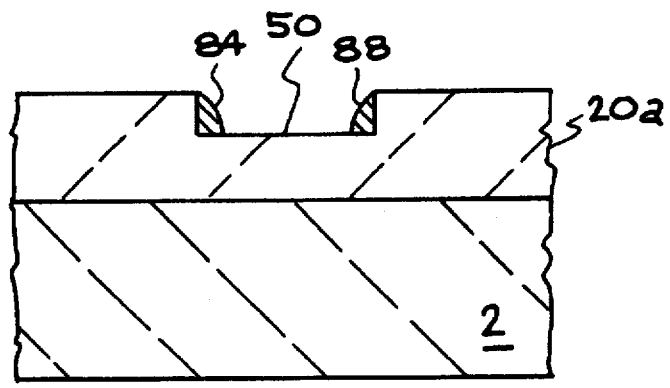
FIG. 11 is a fragmentary vertical cross-sectional view of the structure of FIG. 9 taken along lines 11—11 to show an end-section view of the structure of FIG. 9, illustrating the metal stringers formed on the other two sidewalls of the rectangular fuse recess.

After deposition of tungsten layer 80, and the filling of vias 70 and 72, as well as fuse recess 50, thereby with tungsten metal, tungsten layer 80 is planarized to remove all of the tungsten over insulation layer 20a, leaving only tungsten potions 80a and 80b respectively in vias 70 and 72, and tungsten stringers 82, 84, 86, and 88 respectively on the four sidewalls of rectangular fuse recess 50, as shown in FIGS. 9–11.

Figure 12:
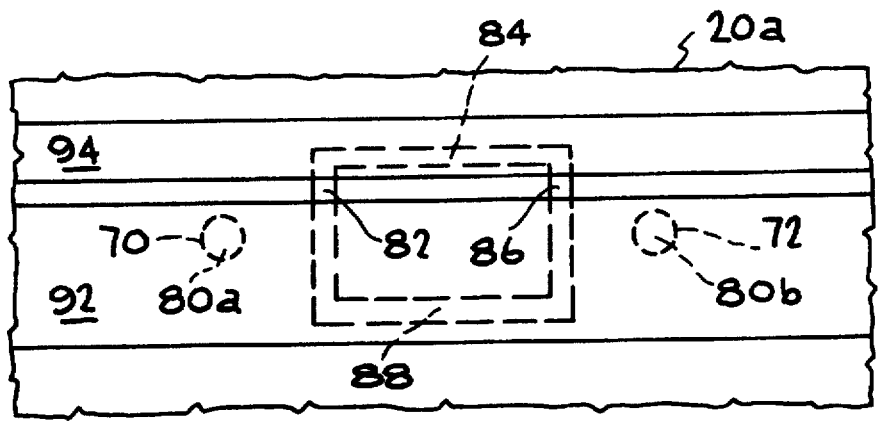
FIG. 12 is a fragmentary top view of the structure of FIG. 9 showing the formation of metal lines over the insulation layer which are respectively connected to opposite ends of two of the metal stringers to form a fuse therebetween.

Following this step, electrical connections may be made to the fuse of the invention simultaneous with the steps of depositing and patterning a metal layer comprising metal lines 92 and 94 over insulation layer 20a to connect to tungsten-filled vias 70 and 72. Thus, as shown in FIG. 12, metal lines 92 and 94 are shown formed over insulation layer 20a, with metal line 92 overlying (and electrically connected to) tungsten plugs 80a and 80b respectively in filled vias 70 and 72, as well as overlying stringer 88, while second metal line 94 overlies stringer 84. Stringers 82 and 86, extending between lines 92 and 94, thus collectively comprise a fuse electrically connecting lines 92 and 94 together.

It should be noted that regardless of what metal constitutes metal layer 80 from which stringers 82–88 are formed, the subsequently deposited metal layer (from which metal lines 92 and 94 are formed) should comprise a different metal than metal layer 80 to thereby permit selective patterning of the subsequent metal layer to form metal lines, such as metal lines 92 and 94, without also etching metal stringers 82–88. Thus, for example, when metal layer 80 comprises tungsten, to permit filling of vias 70 and 72 with tungsten metal (which is a preferred material for filling vias and/or contact openings), the subsequently deposited metal layer which is patterned to form metal lines 92 and 94 preferably constitutes a different metal such as aluminum, or an alloy of aluminum and copper.

Figure 13:
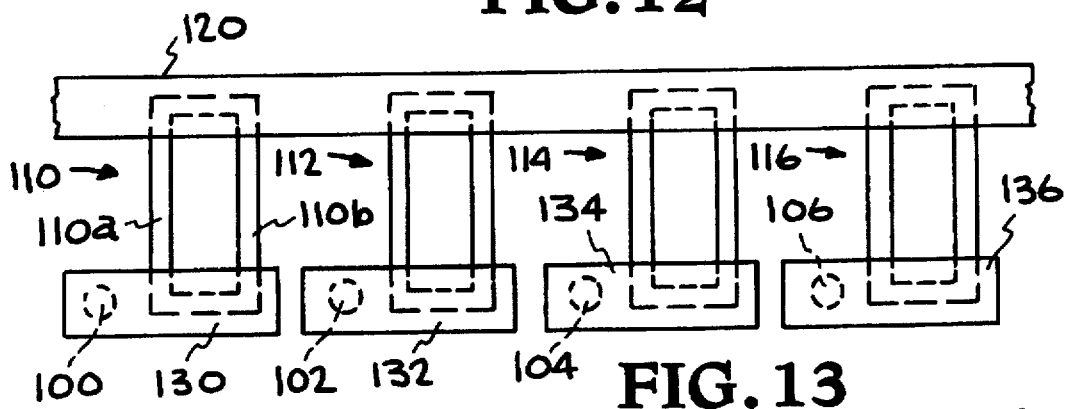
FIG. 13 is another fragmentary top view of an integrated circuit structure containing the fuse structure of the invention and illustrating other ways in which the fuse structure may be utilized.

FIG. 13 shows another example of how the metal fuses of the invention can be utilized to interconnect a common buss with the respective source regions of a number of MOS transistors, each comprising a portion of a separate memory cell. When the particular memory cell is enabled, e.g., through the gate electrode of the MOS transistor, a high current may be passed from the buss line through the fuse to the source region of the particular MOS transistor, thus causing the particular fuse to blow to that memory cell. Thus, for example, when a gate electrode is addressed, of one of a number of transistors represented by their respective source contacts 100, 102, 104, and 106 located on the upper surface of insulation layer 20a, current flows from common buss 120 through fuse 110 and buss 130 to source contact 100 of the first transistor. By flowing a sufficiently high current through common buss 120 to and through fuse 110 to source contact 100, legs 110a and 110b of fuse 110 will melt and be severed, thus disconnecting common buss 120 from source contact 100, i.e., disconnecting common buss 120 from the first transistor. Similarly common buss 120 may be electrically disconnected from the other transistors represented by source contacts 102, 104, and 106, by respectively blowing fuses 112, 114, and 116.

It should also be noted that the steps of masking insulation layer 20a to form the fuse recess mask, followed by the etching of the fuse recess in the insulation layer may, in some circumstances, be combinable with the steps of forming the via mask and etching the via in the insulation layer. That is, the same mask may, in some circumstances, be used for both the vias and the fuse recess, followed by a common etching step in which the fuse recess is formed simultaneous with the cutting of the vias or contact openings through insulation layer 20a. However, such will only be possible when (1): the desired depth of the fuse recess is the same or greater than the depth of the vias to be cut (i.e., the thickness of insulation layer 20a in the region where the fuse recess is to be formed will exceed the thickness of insulation layer 20a in the region where the via is to be cut through insulation layer 20a); and (2): the region of the integrated circuit beneath that portion of insulation layer 20a where the fuse recess will be formed does not have raised portions which would interfere with the formation of a fuse recess of a depth equal to the depth of the via being simultaneously cut (i.e., there must not be raised portions such as raised lines beneath the region of insulation layer 20a where the fuse recess will be cut, since this would thin insulation layer 20a sufficiently in that region so as to risk etching through insulation layer 20a during the formation of the fuse recess at that point while etching deep enough to simultaneously form vias).

Figure 14:
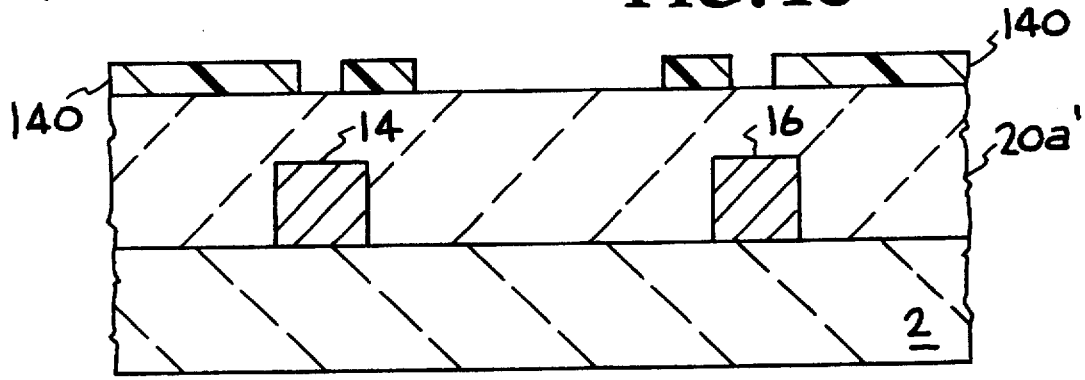
FIG. 14 is a fragmentary vertical side-section view of a mask used in an alternate embodiment of the invention to simultaneously form the fuse recess and the vias in the insulation layer.
Figure 15:
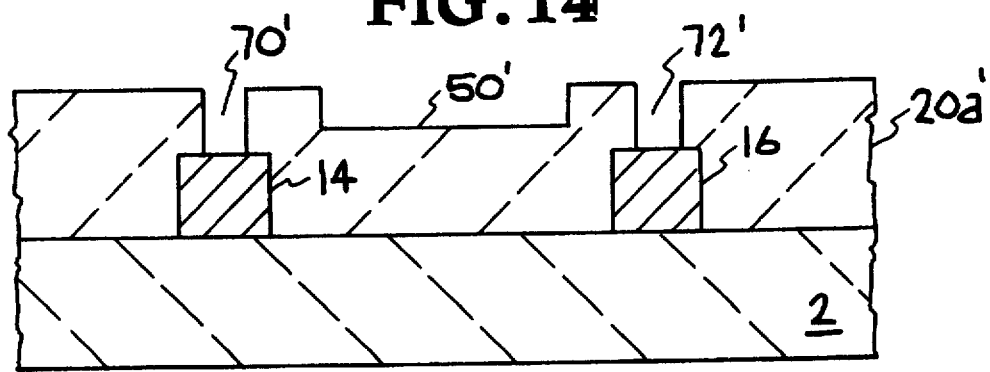
FIG. 15 is a fragmentary vertical side-section view of the structure of FIG. 14 after the insulation layer has been etched to form the vias and fuse recess in a single etch step.

This embodiment is illustrated in FIGS. 14 and 15. FIG. 14 shows fuse recess mask 40 of FIG. 3 and via mask 60 of FIG. 6 combined into a single mask 140 having an opening for the fuse recess and openings for the vias. FIG. 15 shows the result when fuse recess 50' is cut to a depth which equals or exceeds the depth of vias 70' and 72' using such a common mask to simultaneously etch both fuse recess 50' and vias 70' and 72' in insulation layer 20a'.

Thus, the invention provides a process for forming a fuse in an insulation layer and the resulting product wherein additional steps needed for forming such a fuse are minimized or eliminated by forming the fuse in the same insulation layer in which contact openings or vias are formed; using the same metal deposition step used for filling the vias or contact openings to also provide the metal utilized in the fuse; and using the same planarizing step used to remove the portions of the metal layer over the insulation layer, after filling of the vias and fuse recess, to form the metal stringers used as fuses in the invention.

Having thus described the invention what is claimed is:

1. An integrated circuit structure comprising one or more metal-filled vias or contact openings and one or more metal fuses formed in the same insulation layer formed over other portions of said integrated circuit structure which comprises:

a) an integrated circuit structure having raised portions thereon comprising raised lines and/or raised gate electrodes;

b) a single layer of insulation formed over said integrated circuit structure;

c) one or more rectangular recesses formed in an upper surface of said single insulation layer over one or more regions of said integrated circuit structure where none of said raised portions of said integrated circuit structure are located, whereby metal subsequently deposited in said one or more recesses to form said one or more metal fuses will not contact said one or more raised portions of said integrated circuit structure;

d) one or more vias or contact openings extending through said same single insulation layer to at least one of said raised portions of said integrated circuit structure beneath said single insulation layer;

e) a single metal layer deposited over said insulation layer and into said one or more recesses and into said one or more vias or contact openings to fill up said recesses and said vias or contact openings, said metal layer planarized, after being deposited, to remove said metal from said upper surface of said single insulation layer, leaving metal from said metal layer in said one or more vias or contact openings and also leaving metal from said same metal layer as one or more metal stringers on sidewalls of said one or more recesses; and f) one or more metal lines formed on said insulation layer in electrical contact with at least one end of one or more of said metal stringers;

whereby said metal stringers in contact with said one or more metal lines will function as a fuse between said one or more lines and other portions of said integrated circuit structure in electrical contact with an opposite end of said metal stringers in contact with said one or more metal lines, and said fuse formed in said recess will not contact said raised portions of said integrated circuit structure.

2. The integrated circuit structure of claim 1 wherein said metal layer deposited over said insulation layer to fill said one or more vias or contact openings and said one or more rectangular recesses comprises a tungsten-containing metal and said metal lines comprise aluminum.

3. The integrated circuit structure of claim 1 wherein each of said one or more rectangular recesses, formed over said one or more regions of said integrated circuit structure where none of said raised portions of said integrated circuit structure are located, has a depth less than the thickness of said insulation layer, whereby metal subsequently deposited in said one or more recesses to form said one or more metal fuses will not contact said integrated circuit structure.

4. The integrated circuit structure of claim 1 wherein said metal layer which fills said contact openings in said insulation layer and from which said one or more metal stringers comprising said fuses are formed comprises a metal selected from the group consisting of tungsten, titanium, and mixtures thereof.

5. The integrated circuit structure of claim 1 wherein said single layer of insulation is formed from an insulation material selected from the group consisting of silicon oxide and silicon nitride.

6. The integrated circuit structure of claim 1 wherein said one or more metal lines are formed from a metal selected from the group consisting of aluminum, gold, platinum, tungsten, titanium, and mixtures thereof.

7. An integrated circuit structure having one or more fuses and one or more vias or contact openings formed in the same insulation layer therein comprising:

a) a semiconductor substrate having raised gate electrodes and raised lines comprising raised portions of said integrated circuit structures formed therein;

b) a single insulation layer formed over said semiconductor substrate, said single insulation layer consisting essentially of an insulation material selected from the group consisting of silicon oxide and silicon nitride;

c) one or more rectangular recesses formed in said single insulation layer over one or more regions of said semiconductor substrate where no underlying raised portions of said integrated circuit structure are positioned, whereby metal subsequently deposited in said one or more recesses will not contact said underlying raised portions of said integrated circuit structure, said one or more recesses formed to a depth at least equal to the thickness of said single insulation layer over said gate electrodes, each of said one or more rectangular recesses having sidewalls thereon;

d) one or more contact openings or vias extending completely through said same single insulation layer to said raised gate electrodes underlying said single layer of insulation;

e) a metal selected from the group consisting of tungsten, titanium, and mixtures thereof filling said one or more contact openings and comprising metal stringers formed in said one or more rectangular recesses adjacent said sidewalls of said one or more rectangular recesses, said one or more metal stringers and said metal in said one or more contact openings formed from a single layer of said metal formed over said single insulation layer and then planarized to leave only said metal in said contact openings or vias and said metal stringers in said one or more recesses; and f) one or more metal lines on said insulation layer in electrical contact with at least one end of said one or more metal stringers, said one or more metal lines consisting essentially of a metal selected from the group consisting of aluminum, gold, platinum, tungsten, titanium, and mixtures thereof;

wherein said one or more metal stringers function as a fuse between said one or more lines and other portions of said integrated circuit structure in electrical contact with an opposite end of said one or more metal stringers in electrical contact with said one or more metal lines.

* * * * *